United States Patent
Kataoka et al.

(10) Patent No.: US 9,698,710 B2
(45) Date of Patent: Jul. 4, 2017

(54) SOLAR ENERGY UTILIZATION SYSTEM

(71) Applicant: Sharp Kabushiki Kaisha, Osaka-shi, Osaka (JP)

(72) Inventors: Kohtaroh Kataoka, Osaka (JP); Masaru Nomura, Osaka (JP); Takeshi Shiomi, Osaka (JP); Shuji Wakaiki, Osaka (JP); Akihide Shibata, Osaka (JP); Hiroshi Iwata, Osaka (JP)

(73) Assignee: Sharp Kabushiki Kaisha, Sakai-shi, Osaka (JP)

( * ) Notice: Subject to any disclaimer, the term of this patent is extended or adjusted under 35 U.S.C. 154(b) by 0 days.

(21) Appl. No.: 14/905,005

(22) PCT Filed: Apr. 7, 2014

(86) PCT No.: PCT/JP2014/060052
§ 371 (c)(1),
(2) Date: Jan. 14, 2016

(87) PCT Pub. No.: WO2015/025557
PCT Pub. Date: Feb. 26, 2015

(65) Prior Publication Data
US 2016/0164440 A1    Jun. 9, 2016

(30) Foreign Application Priority Data

Aug. 22, 2013  (JP) .................. 2013-172095

(51) Int. Cl.
*H02P 6/06*     (2006.01)
*G05F 1/67*     (2006.01)
(Continued)

(52) U.S. Cl.
CPC ................. *H02P 6/06* (2013.01); *G05F 1/67* (2013.01); *H01L 31/042* (2013.01); *H02J 7/35* (2013.01);
(Continued)

(58) Field of Classification Search
CPC .......... H02P 6/06; H02M 3/335; H02M 7/537
(Continued)

(56) References Cited

U.S. PATENT DOCUMENTS

2002/0163323 A1* 11/2002 Kasai .................. G05F 1/67
323/284

FOREIGN PATENT DOCUMENTS

| JP | 2012244652 A | 12/2012 |
| JP | 2013008206 A | 1/2013 |

(Continued)

OTHER PUBLICATIONS

Machine translation JP2013008206A.*
(Continued)

*Primary Examiner* — Kawing Chan
(74) *Attorney, Agent, or Firm* — Alleman Hall Creasman & Tuttle LLP

(57) ABSTRACT

A solar energy utilization system includes a solar panel, a motor driven by an inverter circuit functioning as a motor drive circuit with power output by the solar panel, a solar output voltage monitor functioning as a monitor that monitors an input or an output of the solar panel and also functioning as a monitor that monitors an input or an output of the inverter circuit, and a controller. The controller has a control mode in which the inverter circuit is controlled such that an output voltage of the solar panel is maintained at a voltage higher than a maximum power point voltage. In this control mode, the controller performs the control such that a rotation speed of the motor is changed repeatedly at predetermined timings.

5 Claims, 13 Drawing Sheets

(51) Int. Cl.
| | |
|---|---|
| *H02M 3/28* | (2006.01) |
| *H02M 7/48* | (2007.01) |
| *H02J 7/35* | (2006.01) |
| *H02M 7/5387* | (2007.01) |
| *H01L 31/042* | (2014.01) |
| *H02M 3/335* | (2006.01) |
| *H02M 7/537* | (2006.01) |

(52) U.S. Cl.
CPC ......... *H02M 3/28* (2013.01); *H02M 3/33523* (2013.01); *H02M 7/48* (2013.01); *H02M 7/4807* (2013.01); *H02M 7/537* (2013.01); *H02M 7/53871* (2013.01); *Y02E 10/50* (2013.01)

(58) Field of Classification Search
USPC .............................. 318/400.03, 400.01, 700
See application file for complete search history.

(56) References Cited

FOREIGN PATENT DOCUMENTS

| | | |
|---|---|---|
| JP | 2013097596 A | 5/2013 |
| JP | 2013099039 A | 5/2013 |
| JP | 2013099069 A | 5/2013 |
| WO | 2006080112 A1 | 8/2006 |

OTHER PUBLICATIONS

ISA Japanese Patent Office, International Search Report Issued in Application No. PCT/JP2014/060052, Jun. 10, 2014, WIPO, 4 pages.

* cited by examiner

SOLAR ENERGY UTILIZATION SYSTEM

TECHNICAL FIELD

The present invention relates to a solar energy utilization system.

BACKGROUND ART

There are various proposals for a system in which solar energy is converted to electric power by a solar panel (solar cell panel) and a device is driven by the electric power. An example thereof may be found in PTL 1.

PTL 1 discloses a motor drive apparatus and an air conditioner. An output voltage from a solar battery is boosted by a DC-DC converter. The DC-DC converter includes a conversion circuit, a switching control circuit, and an input voltage control circuit. The input voltage control circuit controls the switching control circuit by a feedback control scheme such that the voltage at an input terminal of the DC-DC converter is not smaller than a predetermined voltage value.

CITATION LIST

Patent Literature

PTL 1: Japanese Unexamined Patent Application Publication No. 2013-8206

SUMMARY OF INVENTION

Technical Problem

In a case where a motor is driven by an inverter only using an output from a solar panel, it is necessary to operate the motor at a voltage exceeding a maximum power point of the solar panel. In a feedback control performed by an inverter controller that controls the inverter so as to maintain a rotation at a fixed rotation speed, if a reduction in the input voltage occurs due to a reduction in input power caused by a fluctuation of a system or the like, the feedback control tries to increase a current to maintain the input power. When the motor is operated with a voltage exceeding the maximum power point and the voltage decreases due to an increase in current, then the output of the solar panel increases, and thus the inverter controller can continue the control without encountering a lack of electric power. On the other hand, when the motor is operated with a voltage that is lower than the maximum power point and the voltage decreases due to an increase in current, then the output of the solar panel decreases, and thus it becomes impossible to maintain the operation of the motor. As a result, the motor experiences an operation failure.

In view of the above, it is an object of the present invention to provide a solar energy utilization system configured to drive a load, including a motor, by electric power output from a solar panel such that the motor can be operated in a stable manner even when using only the output from the solar panel.

Solution to Problem

A solar energy utilization system according to the present invention includes a solar panel, a motor driven by electric power output by the solar panel, a motor drive circuit that drives the motor, a monitor that monitors an input or an output of the motor drive circuit, and a controller wherein the controller has a control mode in which the motor drive circuit is controlled such that an output voltage of the solar panel is maintained at a voltage higher than a maximum power point voltage, and wherein in the control mode, the controller controls the motor such that the rotation speed of the motor is changed repeatedly at predetermined timings.

This configuration makes it possible to estimate a margin of the output power of the solar panel to its maximum power point, based on changes in the output of the solar panel that occur when the rotation speed of the motor is changed at predetermined timings. This makes it possible to perform the control such that the output voltage of the solar panel is above the maximum power point voltage (that is, the voltage at the maximum power point), and such that the difference between the maximum power point voltage and the output voltage is maintained within a predetermined range. Because the motor is always operated at a voltage above the maximum power point voltage of the solar panel, it is possible to operate the motor in a stable manner even when using only the output from the solar panel.

In the solar energy utilization system configured in the above-described manner, preferably, the motor may be an inverter control motor, the motor drive circuit may be an inverter circuit, and a DC-DC converter may be disposed between the inverter circuit and the solar panel.

In the solar energy utilization system configured in the above-described manner, preferably, the DC-DC converter may include a primary side switch, a transformer, and a secondary side rectifier including a metal-oxide semiconductor field-effect transistor (MOSFET), wherein in the control mode, switching of the primary side switch may be performed with a substantially fixed duty, and the secondary side rectifier may perform synchronous rectification in a complementary manner with the primary side switch.

In the solar energy utilization system configured in the above-described manner, preferably, the transformer may include a tertiary winding, and the driving power of the controller may be supplied from the tertiary winding.

In the solar energy utilization system configured in the above-described manner, preferably, the control mode may be executed when the input voltage of the inverter circuit is equal to or greater than a predetermined value.

The present invention provides a solar energy utilization system configured to include a refrigerator, an air-conditioner, or a pump, each including a motor.

This configuration makes it possible to achieve the refrigerator, the air-conditioner, or the pump capable of effectively using the electric power generated by the solar panel and, in addition, makes it possible to achieve a stable operation even in a case where the driving is performed using only the electric power generated by the solar panel.

Advantageous Effects of Invention

According to the present invention, based on a change in the output of the solar panel caused by varying the rotation speed of the motor repeatedly at predetermined timings, it is possible to estimate a margin of the output power of the solar panel to its maximum power point. This makes it possible to perform the control such that the output voltage of the solar panel is higher than the maximum power point voltage (that is, the voltage at the maximum power point), and such that the difference between the maximum power point voltage and the output voltage is maintained within a predetermined range. Thus, it becomes possible to operate the motor in a stable and highly efficient manner even when using only the output from the solar panel.

DESCRIPTION OF EMBODIMENTS

Figure 1:
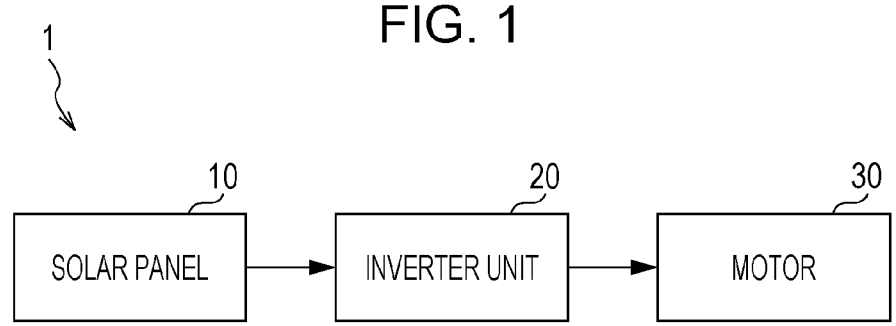
FIG. 1 is a schematic diagram of a solar energy utilization system according to a first embodiment of the present invention.

Referring to the drawings, the first to seventh embodiments are described below.

<First Embodiment>

A solar energy utilization system according to a first embodiment is described in FIG. 1 to FIG. 5. The solar energy utilization system 1 includes a solar panel 10, an inverter 20 that converts DC power generated by the solar panel 10 to AC power, and a motor 30 driven by the AC power supplied from the inverter 20. The motor 30 serves as a power source for a refrigerator, air-conditioner, pump, or other machines. In the present description, the DC power output by the solar panel 10 is also referred to as a "solar output power", an output voltage thereof is also referred to as a "solar output voltage", and an output current thereof is also referred to as a "solar output current".

A solar cell included in the solar panel 10 may be a silicon-based solar cell such as a single crystal silicon solar cell, a polycrystalline silicon solar cell, an amorphous silicon solar cell, or the like, or a compound-based solar cell such as a GaAs solar cell, an InGaAs solar cell, a CdTeCdS-based solar cell, a chalcopyrite-based solar cell, a dye sensitized solar cell, an organic thin-film solar cell, or the like. At the present time, in terms of cost, it may be preferable to employ a polycrystalline or amorphous silicon thin-film solar cell. The solar panel 10 does not necessarily need to be of a flat panel type sealed in glass or the like. The solar panel 10 may be formed in a bendable film shape.

Figure 2:
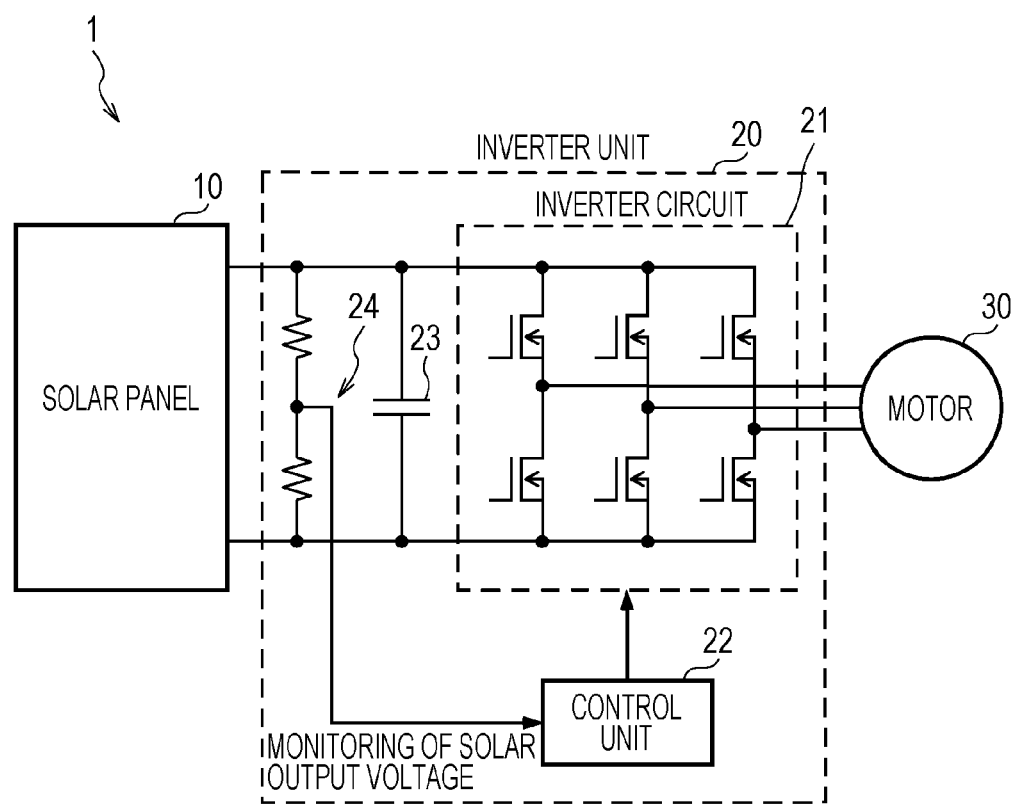
FIG. 2 is a diagram illustrating a configuration according to the first embodiment.

As shown in FIG. 2, the inverter 20 includes an inverter circuit 21, which is controlled by a controller 22. The controller 22 may be a controller dedicated to controlling the inverter circuit 21, or may be a controller responsible for controlling the whole solar energy utilization system 1. The inverter 20 includes, in addition to the inverter circuit 21 functioning as a motor drive circuit, a capacitor 23 connected in parallel to the solar panel 10, and a solar output voltage monitor 24 functioning as a monitor.

In the first embodiment, the solar panel 10 is directly connected to the inverter 20, and thus it is possible for the solar output voltage monitor 24, disposed at an input region of the inverter 20, to directly monitor the output voltage of the solar panel 10. The solar output voltage monitor 24 is also capable of monitoring the input or the output of the inverter circuit 21 functioning as a motor drive circuit.

Under the control of the controller 22, the inverter circuit 21 converts the DC power output by the solar panel 10 to AC power with a voltage value that can be utilized by the motor 30.

The inverter circuit 21 may be a 2-level or 3-level inverter using a PWM (pulse width modulation) method. Alternatively, a VVVF (variable voltage, variable frequency) control method may be employed. The voltage and the frequency of the AC power output by the inverter circuit 21 are determined so as to adapt to the motor 30.

The controller 22 has an AD converter function to detect an input voltage of the inverter circuit 21, that is, the solar output voltage, thereby monitoring the output voltage of the solar panel 10 via the solar output voltage monitor 24. The controller 22 outputs an inverter control signal to the inverter circuit 21 thereby increasing or reducing the rotation speed of the motor 30.

The output power of the solar panel 10 is determined based on the power consumption of the motor 30 functioning as a load. The motor 30 is an AC induction motor or an AC synchronous motor functioning as an inverter control motor. The motor 30 operates with a rotation speed and a torque depending on the output frequency and the output voltage of the AC power output by the inverter circuit 21. The motor 30 may be, for example, a motor operable with a minimum rotation speed of 1,500 rpm, a maximum rotation speed of 5,000 rpm, a maximum consumption power of 150 W, and an operating voltage of 220 V.

The capacitor 23 smooths the electric power generated by the solar panel 10. The inverter circuit 21 receives electric power and outputs electric power to the motor 30 intermittently by switching. The capacitor 23 smooths this electric power such that the solar panel 10 is capable of providing stable low-ripple DC output power.

Figure 3:
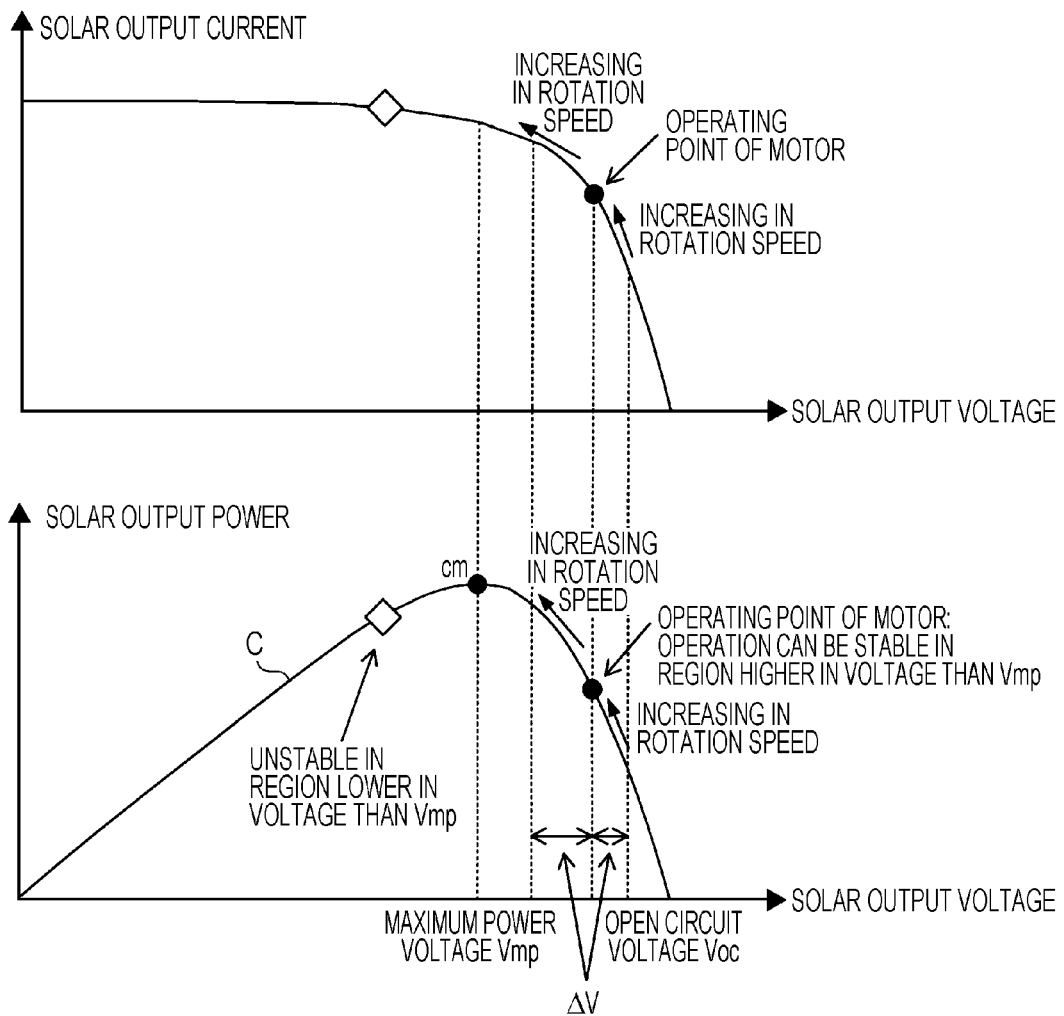
FIG. 3 is a graph illustrating relationships among an output power, an output voltage, and an output current of a solar panel according to the first embodiment.

FIG. 3 illustrates two graphs respectively shown in upper and low areas of FIG. 3. The upper graph illustrates a general output characteristic of a solar panel in the form of an I-V curve (a curve which is plotted so as to represent a relationship between an output current and an output voltage). The lower graph illustrates a general output characteristic of a solar panel in the form of a P-V curve C (a curve which is plotted so as to represent a relationship between an output power and an output voltage). In the P-V curve C, the solar output voltage has a maximum value in an open circuit condition (with no load). The solar output voltage decreases with increasing load and increasing output power. The solar output voltage becomes zero in a short circuit condition. The solar output power has a maximum value when the output voltage is about 80% of the open circuit voltage. An operating point in this situation is referred to as a maximum power point. In FIG. 3, the output voltage at the maximum power point cm on the P-V curve C is denoted as a maximum power point voltage Vmp.

In the first embodiment, the motor 30 is controlled as follows. The controller 22 controls the inverter circuit 21 using a feedback control method such that when a reduction occurs in electric power (input power) input to the inverter circuit 21 from the solar panel 10 and, as a result, a reduction in the input voltage occurs, an increased current is provided to try to maintain the input power. When the motor 30 is driven at a voltage above the maximum power point voltage Vmp, even should a reduction in voltage occur, the current will be increased, which will result in an increase in input power, and thus the motor 30 will operate in a stable manner without encountering a lack of electric power.

In contrast, when the motor 30 is driven at a voltage below the maximum power point voltage Vmp, if the voltage decreases due to an increase in current, then input power decreases, which makes it difficult to continue driving the motor 30. This can cause the driving of the motor 30 to be unstable, and there is a possibility that the motor 30 will stop.

The solar output power does not stay constant. The maximum power point cm and the maximum power point voltage Vmp vary depending on temperature, an amount of sunlight, and the like. Individual differences in the characteristics among the solar panels 10 and a change in the characteristics with time are factors that lead to variations in the solar output power. Thus, in the driving of the motor 30, the driving voltage is to be maintained above the maximum power point voltage Vmp regardless of a change in the solar output power. However, if the voltage is too high, a reduction in solar output power occurs, which results in a reduction in the output of the motor 30. Therefore, the motor 30 is to be driven such that the difference between the maximum power point voltage Vmp and the output voltage is not very large.

Referring to FIG. 3, to maintain the motor operating point within a range of voltage higher than the maximum power point voltage Vmp and to maintain the difference between the maximum power point voltage and the output voltage within a predetermined range, a margin from the motor operating point to the maximum power point cm is to be maintained at a proper value. In view of the above, the controller 22 has a control mode in which the motor drive circuit, that is, the inverter 20, is controlled such that the output voltage of the solar panel 10 is maintained at a voltage above the maximum power point voltage Vmp. In this control mode, a control is performed so as to change the rotation speed of the motor 30 repeatedly at predetermined timings, and, based on a resultant change in the output of the solar panel 10, a margin to the maximum power point cm is estimated and the position of the motor operating point is adjusted. Employing this control mode makes it possible to correctly detect the margin to the maximum power point voltage Vmp and thus properly drive the motor 30 even if variations occur in the maximum power point voltage Vmp due to factors such as sunlight, temperature, individual differences among the solar panels, and changes in the characteristics with time. This control mode is executed when the input voltage of the inverter circuit 21 is equal to or greater than a predetermined value.

The controller 22 changes the consumption power of the motor 30 by intermittently increasing or reducing the rotation speed of the motor 30. In response, the motor operating point moves on the P-V curve as shown in FIG. 3, and a change in the solar output voltage occurs, which is detected as $\Delta V$ by the controller 22 via the solar output voltage monitor 24. In a situation where the voltage is in a range that is sufficiently higher than the maximum power point voltage Vmp, only a small change $\Delta V$ occurs when the rotation speed of the motor 30 is changed by a predetermined fixed amount. As the voltage approaches the maximum power point voltage Vmp, $\Delta V$ increases, as shown in FIG. 3.

In view of the above, a maximum allowable value of $\Delta V$ is determined, and the controller 22 determines whether $\Delta V$ is smaller than the maximum allowable value. Based on a result of this determination, the controller 22 controls the inverter circuit 21 such that the motor operating point moves along the P-V curve C.

If $\Delta V$ is smaller than the maximum allowable value, the controller 22 increases the rotation speed of the motor 30. As a result, the motor operating point moves in a direction toward the maximum power point cm. The controller 22 monitors the change in $\Delta V$, and when the margin between the motor operating point and the maximum power point cm decreases down to a predetermined value (a first predetermined value), the controller 22 switches the direction of the change in the rotation speed of the motor 30 from "increasing" to "returning to a previous rotation speed" or "decreasing".

If $\Delta V$ is greater than the maximum allowable value, the controller 22 reduces the rotation speed of the motor 30. As a result, the motor operating point moves in a direction away from the maximum power point cm. The controller 22 monitors the change in $\Delta V$, and when the margin between the motor operating point and the maximum power point cm increases up to a predetermined value (a second predetermined value), the controller 22 switches the direction of the change in the rotation speed of the motor 30 from "decreasing" to "returning to a previous rotation speed" or "increasing".

By repeating the operation described above, it is possible to drive the motor 30 within a voltage range in which the voltage is above the maximum power point voltage Vmp and the difference between the maximum power point voltage Vmp and the output voltage is within the predetermined range. This makes it possible to drive the motor 30 in a stable manner, and also makes it possible for the motor 30 to use the output power of the solar panel 10 in a most effective manner. When it is assumed that the solar panel has an average characteristic, the difference between the maximum power point voltage Vmp and the output voltage may be set to a voltage equal to, for example, about $1/15$ to $1/10$ of the maximum power point voltage Vmp.

An algorithm of increasing/reducing the rotation speed of the motor 30 may be properly determined such that the above-described conditions are achieved, for example, as follows.

The rotation speed is increased. If a resultant $\Delta V$ is smaller than the maximum allowable value, the rotation speed is also increased in a next control step.

The rotation speed is increased. If a resultant ΔV is equal to or greater than the maximum allowable value, the rotation speed is returned to a previous value, and the rotation speed is reduced in a next control step.

The rotation speed is reduced. If a resultant ΔV is smaller than the maximum allowable value, the rotation speed is returned to a previous value, and the rotation speed is increased in a next control step.

The rotation speed is reduced. If a resultant ΔV is equal to or greater than the maximum allowable value, the rotation speed is further reduced repeatedly until ΔV becomes smaller than the maximum allowable value. When ΔV becomes smaller than the maximum allowable value, the rotation speed is returned to a previous value, and the rotation speed is increased in a next control step.

Figure 4:
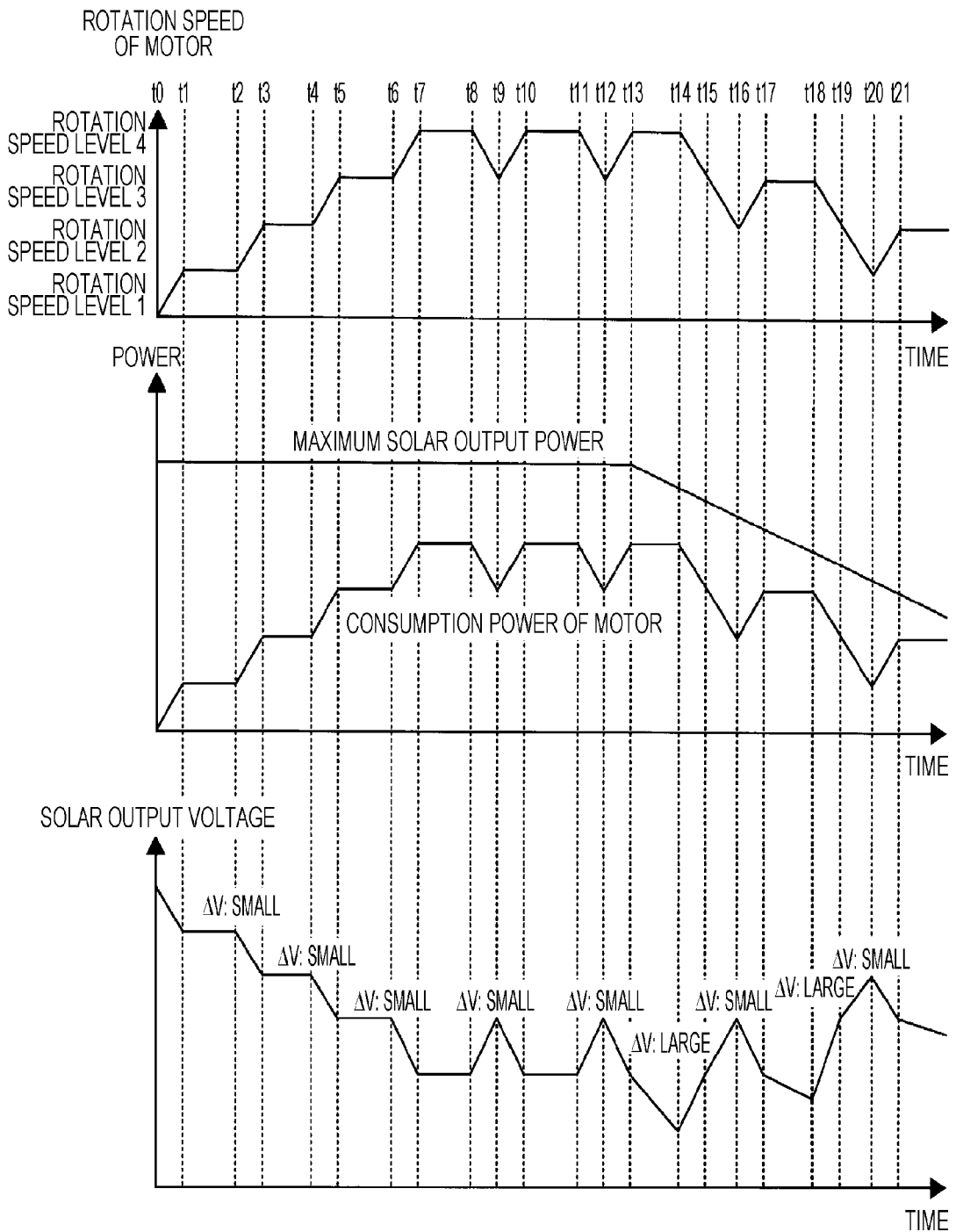
FIG. 4 is a graph illustrating relationships among a motor rotation speed, electric power, and an output voltage of a solar panel according to the first embodiment.

The algorithm of increasing or reducing the rotation speed of the motor 30 may be represented as a sequence as shown in FIG. 4. For simplicity of illustration, it is assumed that the rotation speed of the motor 30 can be at four levels: that is, "rotation speed level 1", "rotation speed level 2", "rotation speed level 3", and "rotation speed level 4". However, it is appropriate and preferable that the number of levels may be higher.

In the sequence illustrated in FIG. 4, the driving of the motor 30 is started at time t0. The rotation speed of the motor 30 increases up to rotation speed level 1 in a period from time t0 to time t1. The consumption power of the motor 30 increases. The solar output power also increases, but the solar output voltage decreases.

The rotation speed of the motor 30 is maintained at rotation speed level 1 over a period from time t1 to time t2. The consumption power of the motor 30 and the solar output voltage also remain at values equal to those at time t1. In a case where the amount of sunlight is not large enough in a period from time t0 to time t2 and therefore the supplied solar output power is not large enough to increase the rotation speed of the motor 30 up to rotation speed level 1, the motor 30 has an operation failure and stops. In this case, after a proper time interval has elapsed, the operation is restarted at time t0.

In a period from time t2 to time t3, the rotation speed of the motor 30 increases up to rotation speed level 2. The consumption power of the motor 30 increases. The solar output power also increases, but the solar output voltage further decreases. There is a large enough margin from the motor operating point to the maximum power point, and the resultant reduction ΔV in the solar output voltage is small. If ΔV is smaller than the maximum allowable value, the rotation speed of the motor 30 is maintained at rotation speed level 2 over a period from time t3 to time t4.

When the rotation speed of the motor 30 increases to rotation speed level 2, if the resultant ΔV is equal to or greater than the maximum allowable value, then the rotation speed of the motor 30 is returned to rotation speed level 1, and is maintained at this value until time t4.

In a period from time t4 to time t5, the rotation speed of the motor 30 increases up to rotation speed level 3. The consumption power of the motor 30 increases. The solar output power also increases, but the solar output voltage decreases. There is a large enough margin from the motor operating point to the maximum power point, and the resultant reduction ΔV in the solar output voltage is small. If ΔV is smaller than the maximum allowable value, the rotation speed of the motor 30 is maintained at rotation speed level 3 over a period from time t5 to time t6.

In a period from time t6 to time t7, the rotation speed of the motor 30 increases up to rotation speed level 4. The consumption power of the motor 30 increases. The solar output power also increases, but the solar output voltage decreases. There is a large enough margin from the motor operating point to the maximum power point, and the resultant reduction ΔV in the solar output voltage is small. If ΔV is smaller than the maximum allowable value, the rotation speed of the motor 30 is maintained at rotation speed level 4 over a period from time t7 to time t8.

Because the rotation speed level 4 is the maximum rotation speed, the controller 22 reduces the rotation speed of the motor 30 down to rotation speed level 3 in a period from time t8 to time t9, and detects ΔV. If ΔV is smaller than the maximum allowable value, the controller 22 determines that there is a large enough margin from the motor operating point to the maximum power point, and thus, at time t10, the controller 22 returns the rotation speed of the motor 30 to a previous level, that is, rotation speed level 4. The rotation speed level 4 is maintained over a period from time t10 to time t11.

In a period from time t11 to time t12, the controller 22 reduces the rotation speed of the motor 30 down to rotation speed level 3, and detects ΔV. If the resultant ΔV is smaller than the maximum allowable value, the controller 22 determines that there is a large enough margin from the motor operating point to the maximum power point, and thus, at time t13, the controller 22 returns the rotation speed of the motor 30 to rotation speed level 4. The rotation speed level 4 is maintained over a period from time t13 to time t14.

Let it be assumed, as illustrated in a middle part of FIG. 4, that at time t13, the amount of sunlight starts to decrease and the maximum solar output power starts to decrease. In the period from time t13 to time t14, although the rotation speed level 4 is maintained and the motor consumption power is also maintained, the solar output voltage gradually decreases.

In a period from time t14 to time t15, the controller 22 reduces the rotation speed of the motor 30 down to rotation speed level 3 and detects ΔV. The reduction in the amount of sunlight has caused the motor operating point to be close to the maximum power point, and thus a reduction in the rotation speed leads to a large ΔV. If ΔV is equal to or greater than the maximum allowable value, the controller 22 determines that the motor operating point has reached a point close to the maximum power point, and thus, in a period from time t15 to time t16, the controller 22 further reduces the rotation speed of the motor 30 down to rotation speed level 2. As a result, the motor operating point moves away from the maximum power point.

If ΔV is smaller than the maximum allowable value during the period from time t15 to time t16, then in a period from time t16 to time t17 the controller 22 returns the rotation speed of the motor 30 to rotation speed level 3. Over a period from time t17 to time t18, the rotation speed level 3 is maintained.

In a period from time t18 to time t19, the controller 22 reduces the rotation speed of the motor 30 down to rotation speed level 2 and detects ΔV. Because the motor operating point is close to the maximum power point, the reduction in the rotation speed leads to a large ΔV. If ΔV is equal to or greater than the maximum allowable value, the controller 22 determines that the motor operating point has reached a point close to the maximum power point, and thus, in a period from time t19 to time t20, the controller 22 further reduces the rotation speed of the motor 30 down to rotation speed level 1. As a result, the motor operating point moves away from the maximum power point.

If ΔV in the period from time t19 to time t20 is smaller than the maximum allowable value, then in a period from time t20 to time t21 the controller 22 returns the rotation speed of the motor 30 to rotation speed level 2.

When the rotation speed is at the rotation speed level 4, this is the maximum rotation speed, and thus in a next control step, the rotation speed is definitely reduced. When the rotation speed is at rotation speed level 1, because rotation speed level 1 is the minimum rotation speed, the rotation speed is definitely increased in a next control step. When the rotation speed is at rotation speed level 2 or 3, the determination as to whether the rotation speed is to be increased or reduced is made according to a predetermined algorithm.

The step width between adjacent levels of the motor rotation speed may be set to 100 to 500 rpm, for example, for a motor with a maximum rotation speed of 5000 rpm.

Alternatively, instead of adjusting the rotation speed of the motor 30 to predetermined levels, ΔV may be set to a predetermined fixed value, and the margin to the maximum power point may be estimated based on an amount of increase or reduction, ΔRPM, in the rotation speed that can achieve the voltage change ΔV. In this case, the rotation speed of the motor 30 is increased or reduced according to the following algorithm.

An input voltage (=V1) at a certain moment is monitored.

The input voltage is monitored while continuously increasing (or reducing) the rotation speed. The increasing (or reducing) is continued until the input voltage becomes equal to V1−ΔV (or until the input voltage becomes equal to V1+ΔV).

The margin to the maximum power point is estimated based on the amount of increase (or reduction) of the rotation speed (=ΔRPM). If ΔRPM is equal to or greater than a predetermined value, there is a large enough margin to the maximum power point, and thus the rotation speed is further increased. If ΔRPM is smaller than the predetermined value, the operating point is very close to the maximum power point, and thus the rotation speed is reduced.

Figure 5:
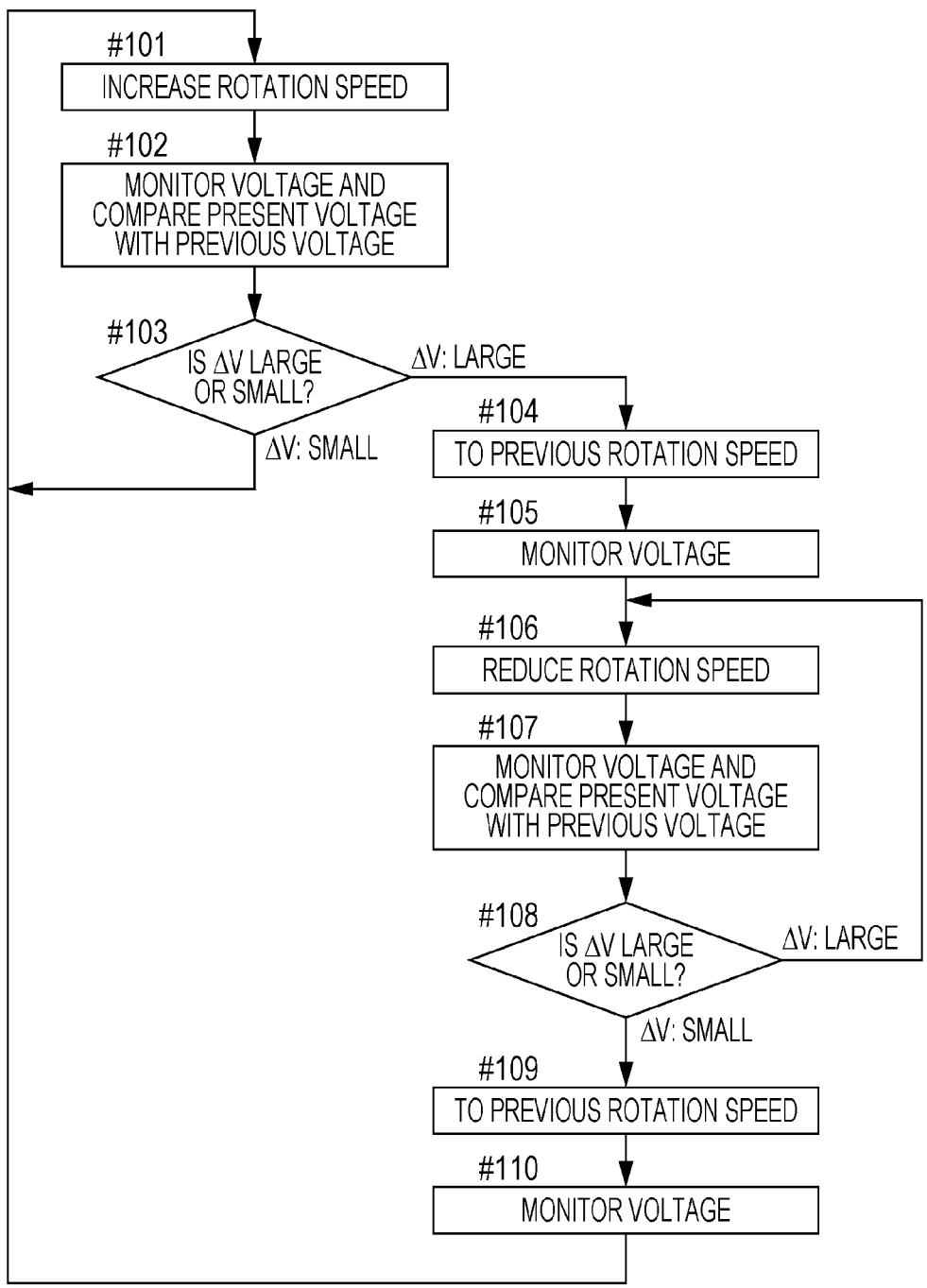
FIG. 5 is a flow chart illustrating an operation according to the first embodiment.

FIG. 5 is a flow chart illustrating an operation of the solar energy utilization system 1.

In step 101, the controller 22 increases the rotation speed of the motor 30.

In step 102, the controller 22 monitors the solar output voltage and compares it with a previous monitored solar output voltage.

In step 103, the controller 22 determines whether the change ΔV in the solar output voltage is large (equal to or greater than a maximum allowable value) or small (less than the maximum allowable value). In a case where it is determined that ΔV is large, the processing flow proceeds to step 104. However, in a case where it is determined that ΔV is small, the processing flow returns to step 101.

In step 104, the controller 22 changes the rotation speed of the motor 30 back to a previous value.

In step 105, the controller 22 monitors the solar output voltage.

In step 106, the controller 22 reduces the rotation speed of the motor 30.

In step 107, the controller 22 monitors the solar output voltage and compares it with a previous monitored solar output voltage.

In step 108, the controller 22 determines whether the change ΔV in the solar output voltage is large (equal to or greater than the maximum allowable value) or small (less than the maximum allowable value). In a case where it is determined that ΔV is large, the processing flow returns to step 106. However, in a case where it is determined that ΔV is small, the processing flow proceeds to step 109.

In step 109, the controller 22 returns the rotation speed of the motor 30 to the previous value.

In step 110, the controller 22 monitors the solar output voltage. Thereafter, the processing flow returns to step 101.

In the following paragraphs, other embodiments of the solar energy utilization system 1 are described. Constituent elements similar to those according to the first embodiment are denoted by similar reference symbols to those used in the first embodiment, and a further description thereof is omitted.

<Second Embodiment>

Figure 6:
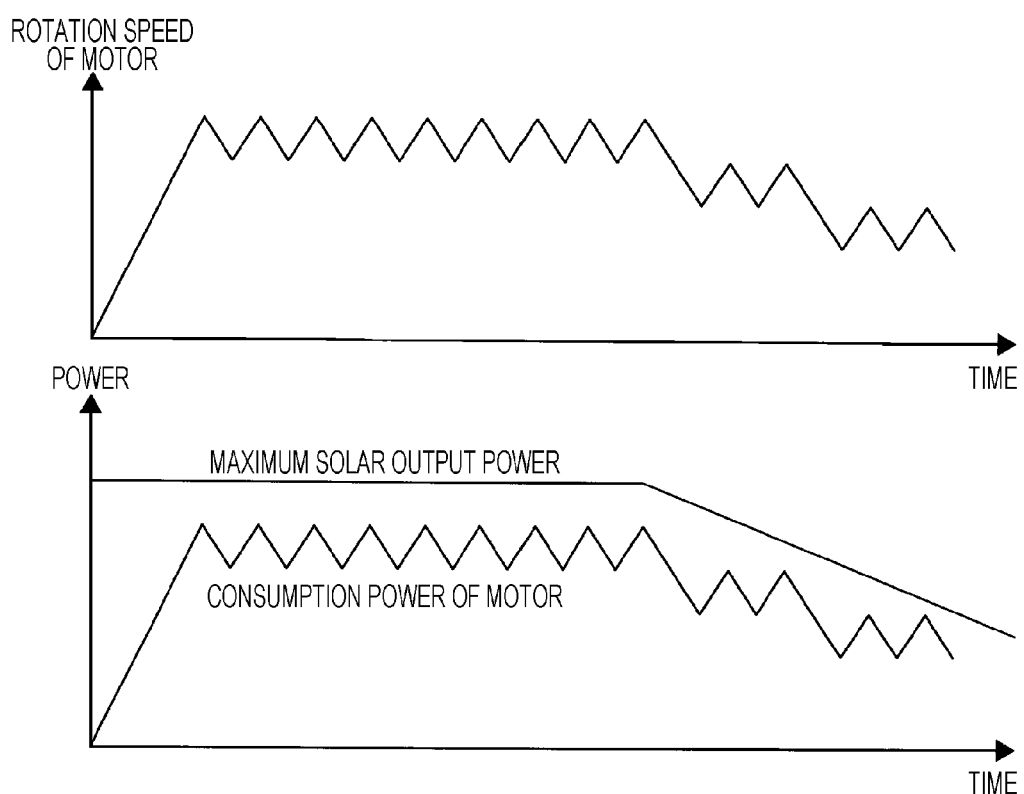
FIG. 6 is a graph illustrating a relationship between a motor rotation speed and electric power in a solar energy utilization system according to a second embodiment of the invention.

FIG. 6 illustrates a solar energy utilization system according to a second embodiment. The second embodiment is different from the first embodiment in the sequence of increasing/reducing the rotation speed of the motor 30. In the sequence according to the first embodiment described above, basically, after the rotation speed of the motor 30 is increased or reduced, the resultant rotation speed is maintained over a proper time period. That is, the rotation speed of the motor 30 is intermittently increased or reduced as a basic structure of the sequence according to the first embodiment above. The second embodiment is characterized such that the increasing and reducing of the rotation speed of the motor 30 is performed continuously without intervals of time therebetween, for example, such that a reduction is performed immediately after an increase, or an increase is performed immediately after a reduction, and so on.

By immediately performing the increase or the reduction at a next control step based on a result of the detection of ΔV resulting from the increase or reduction in the rotation speed of the motor 30, it becomes possible to further respond reliably to a change in the output characteristic of the solar panel 10 caused by a change in sunlight or the like. This makes it possible for the motor 30 to operate in a voltage range higher than the maximum power point voltage Vmp so as to achieve a consumption power close to the maximum solar output power, thereby allowing it to extract as much generated energy as possible. Because of the high accuracy of the response to a change in the amount of sunlight, it is possible to reduce the probability that the motor operating point cannot correctly move in response to a reduction in the amount of sunshine, thus lowering the motor operating point below the maximum power point, which may cause the motor 30 to have an operation failure.

<Third Embodiment>

Figure 7:
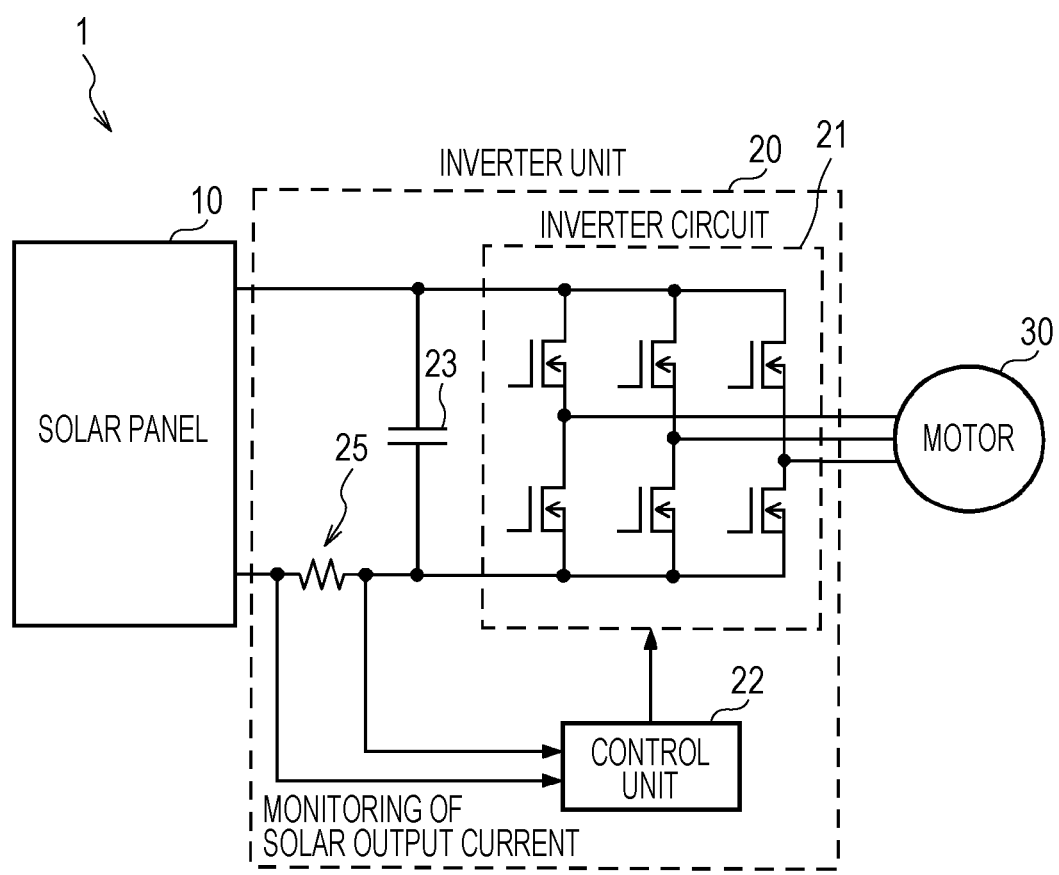
FIG. 7 is a diagram illustrating a configuration of a solar energy utilization system according to a third embodiment of the invention.
Figure 8:
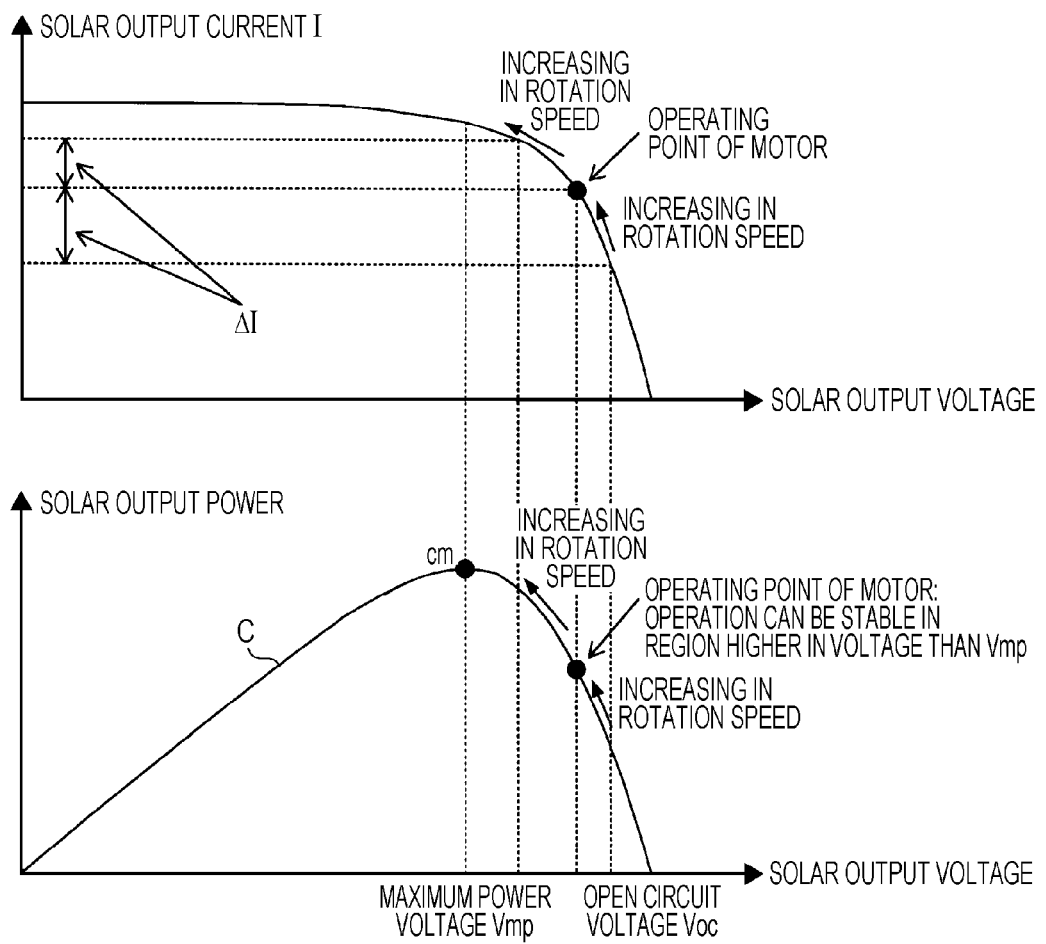
FIG. 8 is a graph illustrating relationships among an output power, an output voltage, and an output current of a solar panel according to the third embodiment.

A solar energy utilization system according to a third embodiment is illustrated in FIG. 7 and FIG. 8. Also in this third embodiment, like the first and second embodiments, the margin from the motor operating point to the maximum power point is estimated by intermittently or continuously increasing and reducing the rotation speed of the motor 30. However, instead of the solar output voltage, the solar output current is selected as the measurement parameter.

As can be seen from an I-V curve in a graph shown in an upper part of FIG. 8, as the solar output voltage decreases, the current increases, but the amount of increase in the current gradually decreases. Based on this, from the magnitude of the amount of change in a current ΔI observed when the rotation speed of the motor 30 is increased or reduced, the margin from the motor operating point to the maximum power point cm is estimated.

To this end, the solar energy utilization system 1 includes a solar output current monitor 25 as illustrated in FIG. 7. In the present embodiment, an input current to the inverter 20 is detected by detecting a voltage drop across a sense resistor in the solar output current monitor 25. The solar panel 10 is connected directly to the inverter 20, and thus it is possible to directly monitor the output current of the solar panel 10 by monitoring the input current to the inverter 20. By using the solar output current monitor 25 functioning as the monitor, it is also possible to monitor the input or the output of the inverter circuit 21 functioning as the motor drive circuit.

The controller 22 monitors a solar output current I1 before the rotation speed of the motor 30 is increased (or reduced) and a solar output current I2 after the rotation speed of the motor 30 is increased (or reduced), and the controller 22 determines $\Delta I=I2-I1$ by calculation. A maximum allowable value K for $\Delta I$ is determined, and the controller 22 determines the relation of the absolute value of $\Delta I$ and the current with respect to the maximum allowable value K. Based on a result of the determination, the controller 22 controls the inverter circuit 21 such that the motor operating point moves along the P-V curve C.

The determination and the control by the controller 22 are performed as follows.

If $K \times |\Delta I| > I1$, it is determined that there is a large enough margin from the motor operating point to the maximum power point cm, and the rotation speed of the motor 30 is increased.

If $K \times |\Delta I| \leq I1$, it is determined that the motor operating point has reached a point close to the maximum power point, and the rotation speed of the motor 30 is reduced.

Note that in the above mathematical expressions, I1 may be replaced by I2, the average value of I1 and I2, or the like.

By repeating the determination and the control described above, it becomes possible for the motor 30 to consume as much solar output voltage as possible while maintaining the condition that the motor 30 is driven by a voltage above the maximum power point voltage Vmp.

In the configuration shown in FIG. 7, the solar output current is directly monitored. Alternatively, the output current from the inverter circuit 21 may be monitored to indirectly monitor the solar output current by estimation.

<Fourth Embodiment>

Figure 9:
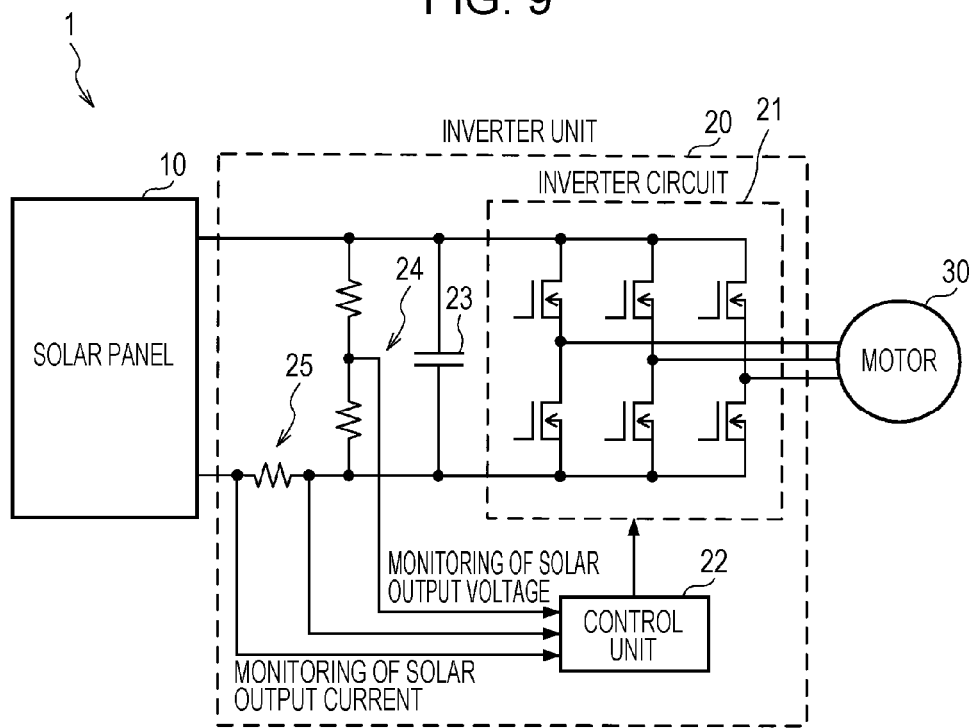
FIG. 9 is a diagram illustrating a configuration of a solar energy utilization system according to a fourth embodiment of the invention.
Figure 10:
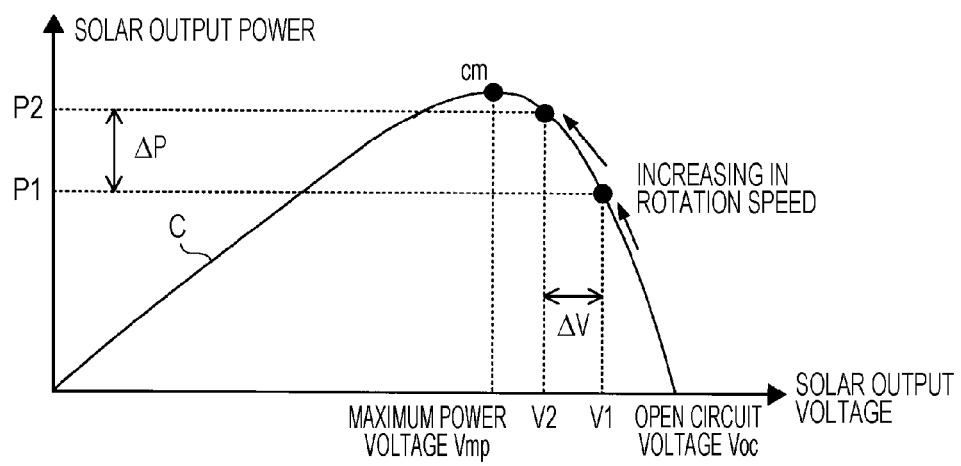
FIG. 10 is a graph illustrating a relationship between an output power and an output voltage of a solar panel according to the fourth embodiment.

A solar energy utilization system according to a fourth embodiment is illustrated in FIG. 9 and FIG. 10. Also in the fourth embodiment, as in the previous embodiments, the margin from the motor operating point to the maximum power point is estimated by intermittently or continuously increasing and reducing the rotation speed of the motor 30. However, the solar output power is selected as the measurement parameter.

In FIG. 10, a graph of a P-V curve C of the solar output power shows that the gradient is large at the open circuit voltage Voc, but the gradient decreases as the point approaches the maximum power point cm and the gradient becomes zero at the maximum power point cm. Using this, based on the amount of change in electric power $\Delta P$ observed when the rotation speed of the motor 30 is increased or reduced, the margin from the motor operating point to the maximum power point cm is estimated.

To this end, as illustrated in FIG. 9, the solar energy utilization system 1 includes a solar output voltage monitor 24 and a solar output current monitor 25. The controller 22 monitors a solar output current I1 and a solar output voltage V1 before the rotation speed of the motor 30 is increased (or reduced) and determines an electric power $P1=I1 \times V1$ by calculation. The controller 22 also monitors a solar output current I2 and a solar output voltage V2 after the rotation speed of the motor 30 is increased (or reduced) and determines electric power $P2=I2 \times V2$ by calculation. By using the solar output voltage monitor 24 and the solar output current monitor 25 functioning as the monitor, it is also possible to monitor the input or the output of the inverter circuit 21 functioning as a motor drive circuit.

Furthermore, an absolute value $\Delta V=|V2-V1|$ of the change between the voltages observed before and after the rotation speed of the motor 30 is increased or reduced, and also an absolute value $\Delta P=|P2-P1|$ of the change between the electric powers observed before and after the rotation speed of the motor 30 is increased or reduced are determined by calculation. A maximum allowable value K is determined, and the controller 22 determines the relation of the absolute value of the voltage change and the absolute value of the power change with respect to the maximum allowable value K. Based on a result of this determination, the controller 22 controls the inverter circuit 21 such that the motor operating point moves on the P-V curve C.

The determination and the control by the controller 22 are performed as follows.

If $K \times \Delta V > \Delta P$, it is determined that there is a large enough margin from the motor operating point to the maximum power point cm, and the rotation speed of the motor 30 is increased.

If $K \times \Delta V \leq \Delta P$, it is determined that the motor operating point has reached a point close to the maximum power point, and the rotation speed of the motor 30 is reduced.

By repeating the determination and the control described above, it becomes possible for the motor 30 to consume as much solar output voltage as possible while maintaining the condition that the motor 30 is driven by a voltage higher than the maximum power point voltage Vmp.

In the fourth embodiment, it is possible to actually trace the P-V curve, and thus it is possible to more reliably estimate the margin to the maximum power point. That is, the consumption power of the motor 30 varies depending on the load even if the rotation speed is the same. The amount of the change in solar output power caused by a change in the rotation speed of the motor 30 is also dependent on the load of the motor 30. Therefore, even if the same change of the rotation speed were applied to the motor 30 under the same sunlight conditions, it would not necessarily be possible to obtain the same $\Delta V$ and $\Delta I$. Therefore, in the first to third embodiments, the maximum allowable value is to be set while taking into account the variations described above. In contrast, the fourth embodiment is based on the P-V curve itself, and thus no influence is received from the magnitude of the load of the motor 30. This makes is possible to achieve accurate control, and it becomes possible to effectively use the electric power generated by the solar panel.

<Fifth Embodiment>

Figure 11:
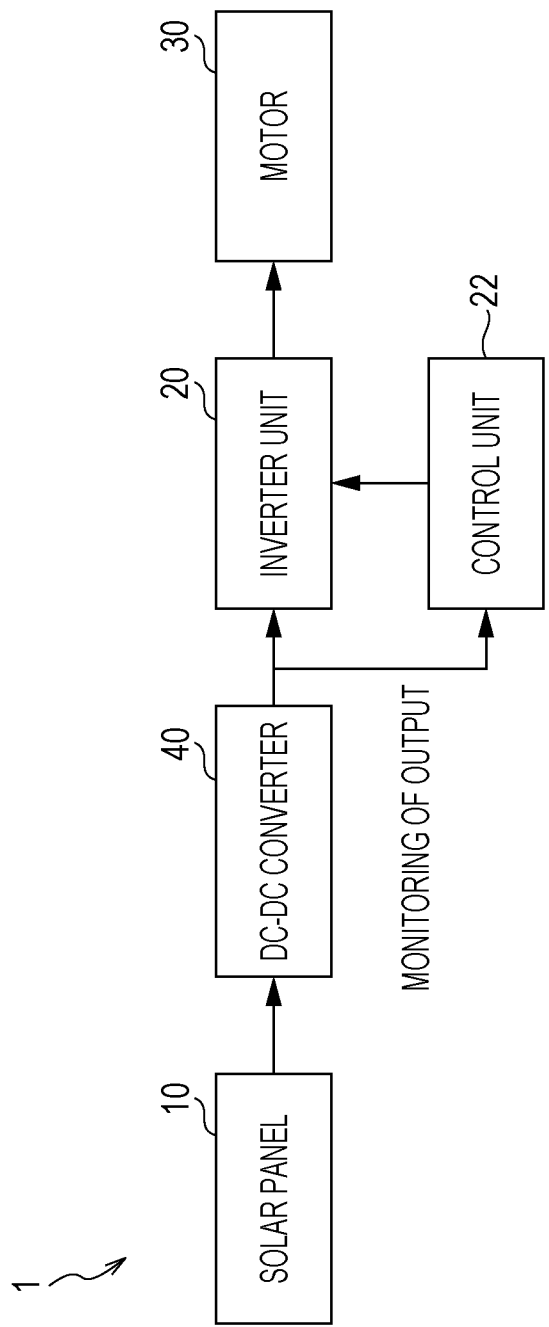
FIG. 11 is a schematic diagram of a solar energy utilization system according to a fifth embodiment of the invention.
Figure 12:
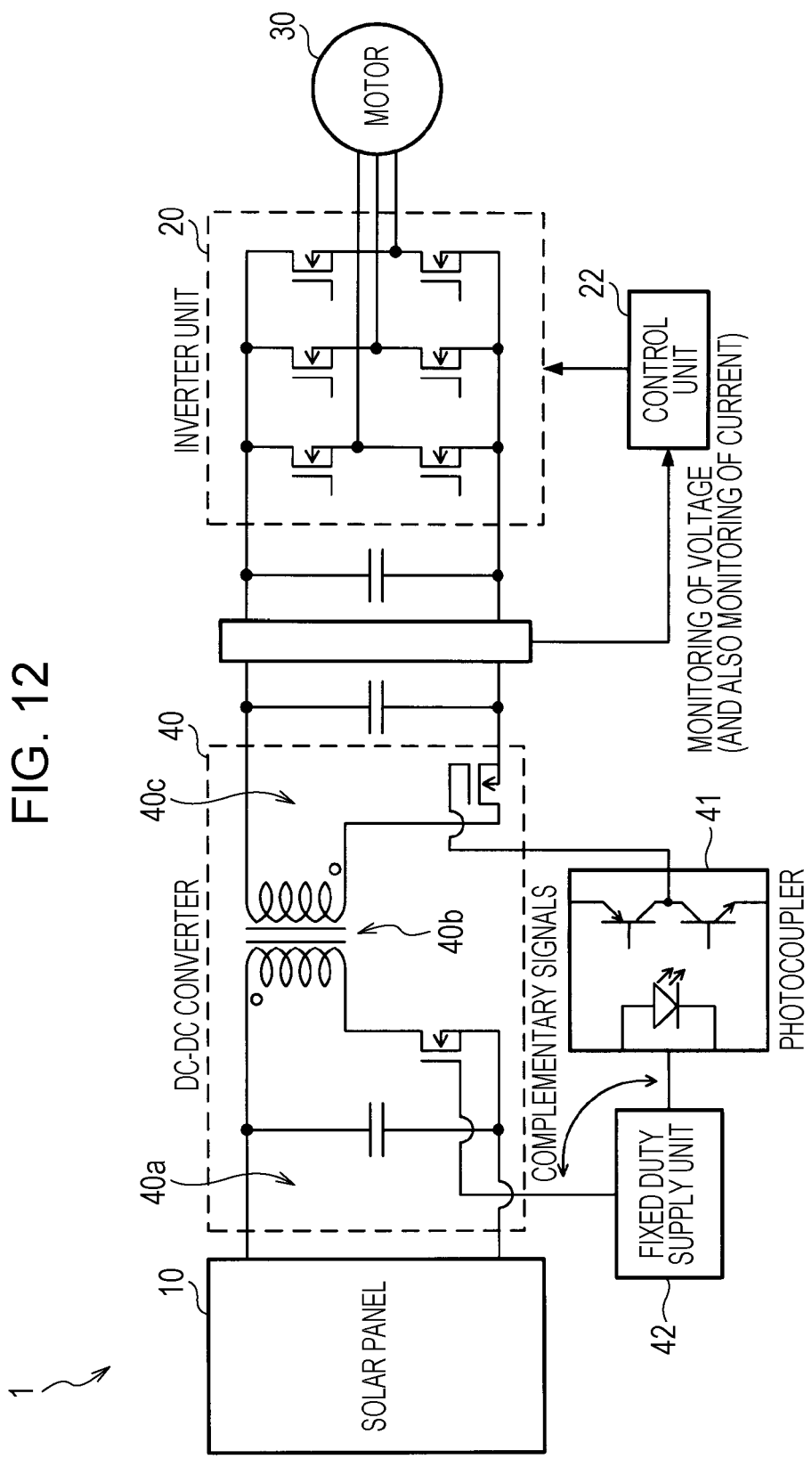
FIG. 12 is a diagram illustrating a configuration according to the fifth embodiment.
Figure 13:
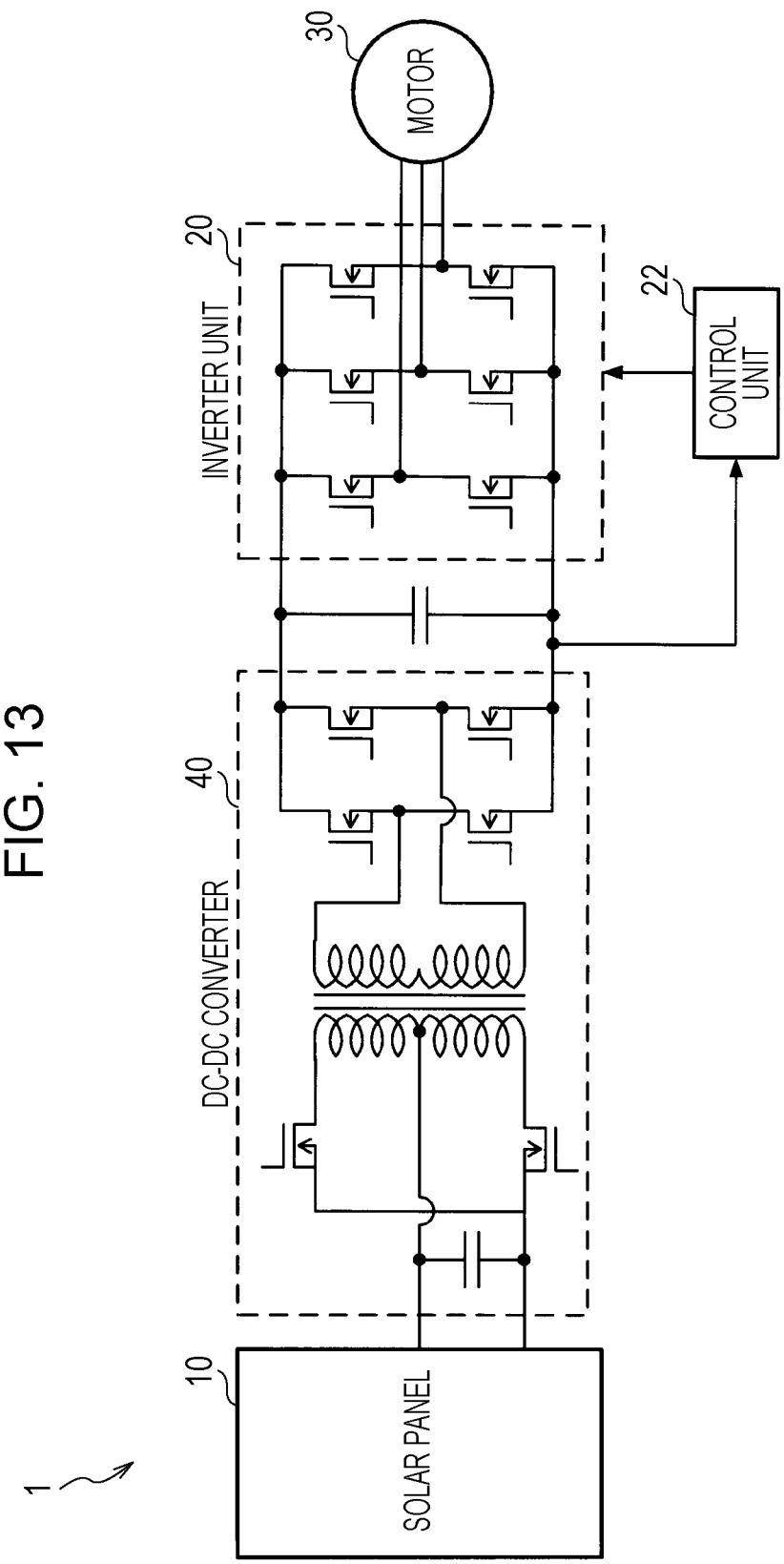
FIG. 13 is a diagram illustrating a configuration according to another example of the fifth embodiment.

A solar energy utilization system according to a fifth embodiment is described in FIG. 11 to FIG. 13. The fifth embodiment is characterized in that a DC-DC converter 40 is disposed between the solar panel 10 and the inverter 20. The DC-DC converter 40 may be, for example, a boost converter. In this case, even when the solar output voltage is lower than a voltage necessary to drive the motor 30, if the solar output power is sufficient, then the solar output voltage can be increased to the voltage necessary to drive the motor 30, thereby making it possible to operate the motor 30.

The controller 22 controls the rotation speed of the motor 30 as required based on the voltage value at the secondary side of the DC-DC converter 40, that is, the voltage value at the input region of the inverter 20.

In the DC-DC converter 40, as illustrated in FIG. 12, a transistor is employed as a rectifier on the secondary side, and the transistor is operated in a complementary manner to the primary side so as to achieve synchronous rectification. The transistor is embedded in a photocoupler 41. This makes it possible for the DC-DC converter 40 to perform a bidirectional power conversion, which makes it possible to prevent the voltage on the secondary side from abnormally increasing even when the inverter 20 stops and an operation occurs with no load. Therefore, it is possible to remove a circuit that feeds back the output voltage of the DC-DC converter 40 to the controller of the DC-DC converter 40.

A transformer of the DC-DC converter 40 may include a tertiary winding, which is not shown, and the driving power to the controller 22 may be supplied from the tertiary winding. In this case, it is possible to supply electric power to the controller 22 disposed on the secondary side without having to provide a plurality of transformers, which allows a reduction in cost. Furthermore, even in a state in which the inverter 20 stops and there is no load, it is possible to continue the operation of the DC-DC converter 40 (without encountering an abnormal increase in the voltage on the secondary voltage), and thus it is possible to continue supplying electric power to the controller 22 and allow the controller 22 to continue monitoring the voltage or the like. Therefore, it is possible to continue detecting a failure when the motor 30 is stopped, for example. This makes it possible to achieve a system with a high level of safety.

The DC-DC converter 40 is connected to a fixed duty supply 42. By continuing the operation of the DC-DC converter 40 according to a fixed duty supplied from the fixed duty supply 42, it is possible to operate the DC-DC converter 40 as a converter that increases or decreases the voltage with a substantially fixed ratio, which makes it possible to achieve simplification of the circuit.

As illustrated in FIG. 12, the DC-DC converter 40 may be formed so as to include a primary side switch 40a, a transformer 40b, and a secondary side rectifier 40c including a MOSFET. During a control mode in which the inverter circuit 21 is controlled such that the output voltage of the solar panel 10 is maintained at a voltage higher than the maximum power point voltage Vmp, by performing the switching of the primary side switch 40a at a substantially fixed duty and by operating the secondary side rectifier 40c in a complementary manner to the primary side switch 40a, it is possible to achieve synchronous rectification.

The controller 22 is capable of indirectly monitoring the solar output voltage (and current) based on the voltage (and the current) on the secondary side of the DC-DC converter 40, and is capable of estimating the margin to the maximum power point by increasing and reducing the rotation speed of the motor 30. This is possible, as described above, because the switching of the switch 40a on the primary side is performed with a substantially fixed duty, and the secondary side rectifier 40c is operated in complimentary synchronization with the primary side switch 40a so as to achieve synchronous rectification. As a result, the voltage ratio between the primary side and the second side, and also the current ratio, are given as a fixed ratio approximately determined by a winding turns ratio of a transformer, and thus it is possible to monitor the state on the primary side, in other words, the output state of the solar panel 10 by monitoring the state on the secondary side. Therefore, when the DC-DC converter 40 is isolated, it is not necessary to go to the lengths of conductively monitoring it, and thus it is possible to achieve simplification of the circuit and a reduction in cost.

The DC-DC converter 40 may have a configuration other than that illustrated in FIG. 12. For example, a circuit configuration illustrated in FIG. 13 may be employed. In this circuit configuration, a push-pull circuit is employed on the primary side, and a full bridge circuit is employed on the secondary side. Furthermore, the DC-DC converter 40 is not limited to an isolated type. A chopper circuit having a synchronous rectifier function may be used.

<Sixth Embodiment>

Figure 14:
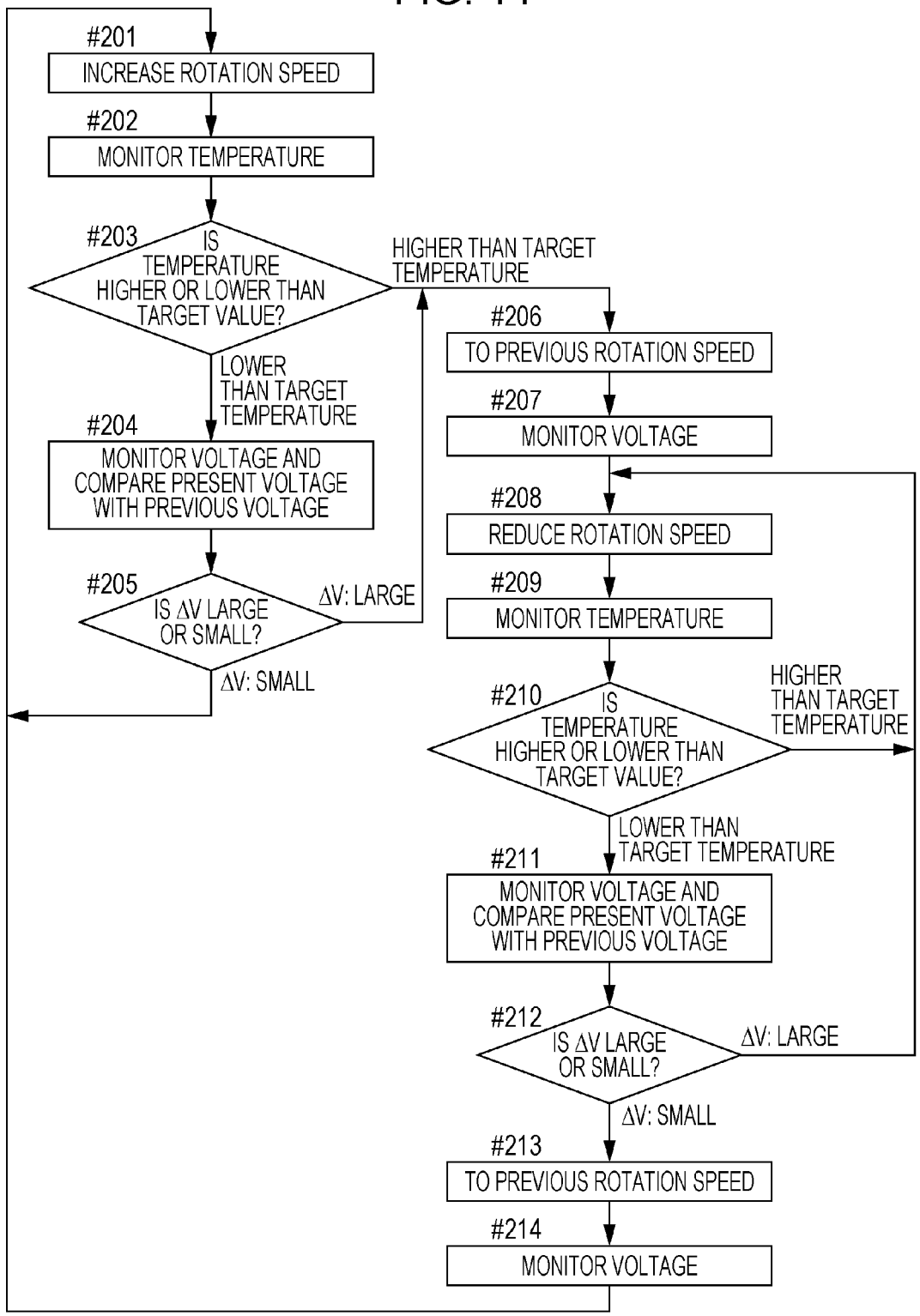
FIG. 14 is a flow chart illustrating an operation of a solar energy utilization system according to a sixth embodiment of the invention.

A solar energy utilization system according to a sixth embodiment is illustrated in FIG. 14. In the sixth embodiment, in a solar energy utilization system according to one of the first to fifth embodiments, a temperature monitoring function is provided to a device that needs a temperature control, such as a refrigerator, an air-conditioner, or the like. Therefore, although a figure is not given here, the solar energy utilization system according to the sixth embodiment includes the same constituent elements as those included in the first to sixth embodiments.

In the sixth embodiment, the rotation speed of the motor 30 is increased and reduced according to the following algorithm.

(a) After the rotation speed is increased, the control operation is performed as follows.

Only in a case where a target temperature is not reached and $\Delta V$ is small (there is a large margin to the maximum power point), the rotation speed of the motor 30 is also increased in the next operation step.

The rotation speed is returned to a previous value in a case where at least one of the following is observed: a temperature higher than the target temperature; and a large $\Delta V$ (a small margin to the maximum power point). In this case, the rotation speed is reduced in the next control step.

(b) After the rotation speed is reduced, the control operation is performed as follows.

Only in a case where a target temperature is not reached and $\Delta V$ is small (there is a large margin to the maximum power point), when the rotation speed is returned to a previous value, the rotation speed is increased in the next control step.

FIG. 14 is a flow chart illustrating an operation of the solar energy utilization system 1 according to the sixth embodiment.

In step 201, the controller 22 increases the rotation speed of the motor 30.

In step 202, the controller 22 monitors the temperature (the temperature managed by the solar energy utilization system with respect to the target value).

In step 203, the controller 22 determines whether the temperature is higher or lower than the target temperature. In a case where it is determined that the temperature is higher than the target temperature, the processing flow proceeds to step 206. In a case where it is determined that the temperature is lower than the target temperature, the processing flow proceeds to step 204.

In step 204, the controller 22 monitors the solar output voltage and compares it with a previous monitored solar output voltage.

In step 205, the controller 22 determines whether the amount of the change $\Delta V$ in the solar output voltage is large (equal to or greater than a maximum allowable value) or small (less than the maximum allowable value). In a case where it is determined that $\Delta V$ is large, the processing flow proceeds to step 206. However, in a case where it is determined that $\Delta V$ is small, the processing flow returns to step 201.

In step 206, the controller 22 returns the rotation speed of the motor 30 to a previous value.

In step 207, the controller 22 monitors the solar output voltage.

In step 208, the controller 22 reduces the rotation speed of the motor 30.

In step 209, the controller 22 monitors the temperature.

In step 210, the controller 22 determines whether the temperature is higher or lower than the target temperature. In a case where it is determined that the temperature is higher than the target temperature, the processing flow returns to step 208. In a case where it is determined that the temperature is lower than the target temperature, the processing flow proceeds to step 211.

In step 211, the controller 22 monitors the solar output voltage and compares it with a previous monitored solar output voltage.

In step 212, the controller 22 determines whether the amount of the change ΔV in the solar output voltage is large (equal to or greater than a maximum allowable value) or small (less than the maximum allowable value). In a case where it is determined that ΔV is large, the processing flow returns to step 208. However, in a case where it is determined that ΔV is small, the processing flow proceeds to step 213.

In step 213, the controller 22 returns the rotation speed of the motor 30 to a previous value.

In step 214, the controller 22 monitors the solar output voltage. Thereafter, the processing flow returns to step 201.

<Seventh Embodiment>

Figure 15:
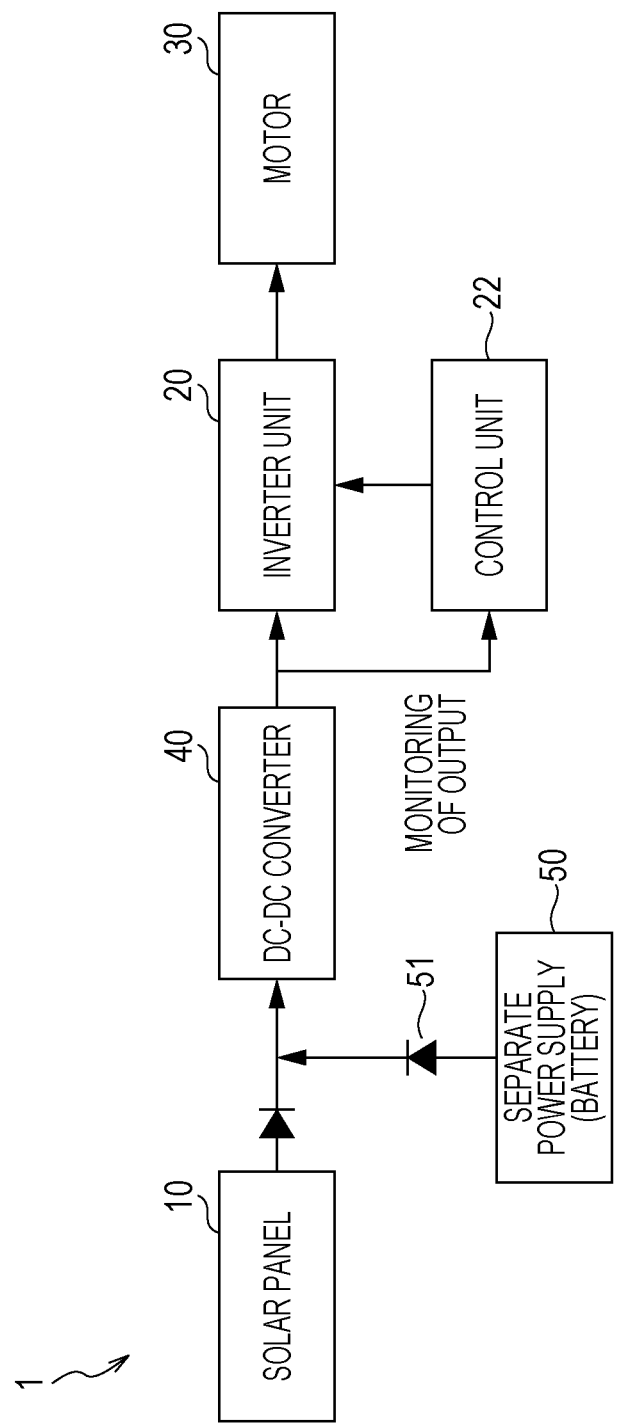
FIG. 15 is a schematic diagram of a solar energy utilization system according to a seventh embodiment of the invention.

A solar energy utilization system according to a seventh embodiment is shown in FIG. 15. In the seventh embodiment, the solar panel 10 and a separate power supply 50 such as a battery are both used as the power supply. In FIG. 15, the battery functioning as the separate power supply 50 is connected via a diode 51 to the output region of the solar panel 10. As for the separate power supply 50, a power supply is used that provides a voltage lower than a maximum power point voltage Vmp of the solar panel 10. The separate power supply 50 is detachably coupled, and the solar energy utilization system 1 can be operated regardless of whether or not the separate power supply 50 is connected.

The controller 22 monitors the input voltage to the inverter 20. In a case where it is detected that the voltage at the output region from the solar panel 10, to which the separate power supply 50 is connected, is equal to or lower than a predetermined value, the controller 22 determines that sufficient electric power is not generated by the solar panel 10 and that electric power is supplied from the separate power supply 50. The controller 22 then changes the control mode to another particular control mode from that in which the rotation speed of the motor 30 is increased and reduced repeatedly according to predetermined timings as described in the previous embodiments.

More specifically, in the particular control mode, preferably, the rotation speed of the motor 30 is maintained at a fixed value such as a minimum rotation speed or the like.

In a case where it is detected that the voltage at the output region is equal to or higher than the predetermined value, the controller 22 determines that a sufficient amount of electric power is generated by the solar panel 10, and the control mode may be preferably returned to the previous mode in which the rotation speed of the motor 30 is increased and reduced repeatedly according to predetermined timings. This makes it possible to control the operation such that, in a case where the separate power supply 50 is also used, the motor 30 is controlled at a predetermined rotation speed, and only in a case, in which sufficient electric power is generated by the solar panel 10, is it possible to extract full power and input it to the motor 30 within a range in which the motor 30 is capable of operating in a stable manner. Thus it is possible to prevent the electric power of the separate power supply 50 from being undesirably consumed while achieving effective usage of the electric power generated by the solar panel 10.

<Additional Points>

In the solar energy utilization system 1 according to the first and second embodiments, the solar output voltage monitor 24, which monitors the output voltage of the solar panel 10, functions as the monitor. In the third embodiment, the solar output current monitor 25, which monitors the output current of the solar panel 10, functions as the monitor. In the fourth embodiment, the solar output voltage monitor 24 that monitors the solar output voltage and the solar output current monitor 25 that monitors the solar output current are provided, and output is monitored by determining the solar power from the solar output voltage and the solar output current. Depending on the situation, it is possible to select any one monitor from among the monitor that monitors the solar output voltage, the monitor that monitors the solar output current, and the monitor that monitors the solar output power.

By using the motor 30 as a motor of a refrigerator, an air-conditioner, or a pump, it is possible to realize the solar energy utilization system so as to include a refrigerator, an air-conditioner, or a pump. This makes it possible for the refrigerator, the air-conditioner, or the pump to effectively use the electric power generated by the solar panel 10. Furthermore, it becomes possible to achieve a stable operation even in a case where the driving is performed only by electric power generated by the solar panel 10.

The present invention has been described above with reference to the embodiments. However, the invention is not limited to these embodiments. Various modifications are possible without departing from the spirit and scope of the present invention.

INDUSTRIAL APPLICABILITY

The present invention can be applied to a wide variety of solar energy utilization systems.

REFERENCE CHARACTER LIST 1 solar energy utilization system
10 solar panel
20 inverter
21 inverter circuit
22 controller
23 capacitor
24 solar output voltage monitor
25 solar output current monitor
30 motor
40 DC-DC converter
41 photocoupler
42 fixed duty supply
50 separate power supply

The invention claimed is:
1. A solar energy utilization system comprising:
   a solar panel that outputs electric power output which varies depending at least on sunlight conditions, the electric power output having a corresponding output voltage;
   a motor driven by the electric power output from the solar panel;
   a motor drive circuit operatively coupled to the solar panel and the motor and configured as an inverter that receives the electric power output from the solar panel and supplies a driving voltage to the motor;

a solar voltage monitor that monitors the output voltage from the electric power output; and a controller operatively coupled to the motor drive circuit and the solar voltage monitor, wherein the controller monitors the output voltage from the solar panel that is received by the motor drive circuit and monitors the driving voltage supplied by the motor drive circuit;

wherein the controller detects if the monitored output voltage of the electric power output is equal to or greater than a maximum power point voltage, wherein the maximum power point voltage is an output voltage at which the electric power output reaches a peak value, wherein when the controller detects that the monitored output voltage of the electric power output is equal to or greater than the maximum power point voltage, the controller operates a control mode in which the motor drive circuit is controlled such that the driving voltage to the motor is maintained at a voltage higher than the maximum power point voltage, and wherein in the control mode, the controller controls a rotation speed of the motor such that the rotation speed of the motor is changed repeatedly at predetermined timings.

2. The solar energy utilization system according to claim 1, wherein
the motor is an inverter control motor, and the motor drive circuit is an inverter circuit, and
a DC-DC converter is disposed between the inverter circuit and the solar panel.

3. The solar energy utilization system according to claim 2, wherein
the DC-DC converter includes a primary side switch, a transformer, and a secondary side rectifier including a MOSFET,
and wherein in the control mode, the primary side switch performs switching with a substantially fixed duty, and the secondary side rectifier performs synchronous rectification in a complementary manner with the primary side switch.

4. The solar energy utilization system according to claim 3, wherein
the transformer includes a tertiary winding, and the controller receives driving power supplied from the tertiary winding.

5. The solar energy utilization system according to claim 1, wherein
the control mode is executed by the controller when an input voltage of the inverter circuit is equal to or greater than a predetermined value.

* * * * *

UNITED STATES PATENT AND TRADEMARK OFFICE
CERTIFICATE OF CORRECTION

PATENT NO. : 9,698,710 B2
APPLICATION NO. : 14/905005
DATED : July 4, 2017
INVENTOR(S) : Kohtaroh Kataoka et al.

Page 1 of 1

It is certified that error appears in the above-identified patent and that said Letters Patent is hereby corrected as shown below:

On the Title Page

In item (71), Applicant, delete "Osaka-shi" and insert --Sakai-shi--.

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*